United States Patent
Yin et al.

(10) Patent No.: US 9,343,530 B2
(45) Date of Patent: May 17, 2016

(54) METHOD FOR MANUFACTURING FIN STRUCTURE OF FINFET

(71) Applicant: Institute of Microelectronics, Chinese Academy of Sciences, Beijing (CN)

(72) Inventors: Haizhou Yin, Poughkeepsie, NY (US); Wei Jiang, Fujian (CN); Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/435,624

(22) PCT Filed: Oct. 25, 2012

(86) PCT No.: PCT/CN2012/083475
§ 371 (c)(1),
(2) Date: Apr. 14, 2015

(87) PCT Pub. No.: WO2014/059686
PCT Pub. Date: Apr. 24, 2014

(65) Prior Publication Data
US 2015/0270341 A1    Sep. 24, 2015

(30) Foreign Application Priority Data
Oct. 18, 2012    (CN) .......................... 2012 1 0395585

(51) Int. Cl.
*H01L 21/336* (2006.01)
*H01L 29/06* (2006.01)
(Continued)

(52) U.S. Cl.
CPC ........ *H01L 29/0692* (2013.01); *H01L 21/0217* (2013.01); *H01L 21/02164* (2013.01);
(Continued)

(58) Field of Classification Search
CPC ............... H01L 29/41791; H01L 29/66795; H01L 29/66818; H01L 29/785; H01L 29/7851
See application file for complete search history.

(56) References Cited

U.S. PATENT DOCUMENTS

| 6,461,888 B1 * | 10/2002 | Sridhar | ............... B81C 1/0015 438/50 |
| 6,645,797 B1 * | 11/2003 | Buynoski | ............. H01L 29/785 438/157 |

(Continued)

FOREIGN PATENT DOCUMENTS

| CN | 1930671 A | 3/2007 |
| CN | 1992185 A | 7/2007 |

OTHER PUBLICATIONS

International Search Report mailed Jul. 25, 2013 in International Application No. PCT/CN2012/083475.

*Primary Examiner* — Laura Menz
*Assistant Examiner* — Maliheh Malek
(74) *Attorney, Agent, or Firm* — Pillsbury Winthrop Shaw Pittman LLP

(57) ABSTRACT

The present invention provides a method of manufacturing a fin structure of a FinFET, comprising: providing a substrate (200); forming a first dielectric layer (210); forming a second dielectric layer (220), the material of the portion where the second dielectric layer is adjacent to the first dielectric layer being different from that of the first dielectric layer (210); forming an opening (230) through the second dielectric layer (220) and the first dielectric layer (2100, the opening portion exposing the substrate; filling a semiconductor material in the opening (230); and removing the second dielectric layer (220) to form a fin structure. In the present invention, the height of the fin structure in the FinFET is controlled by the thickness of the dielectric layer. The etching stop can be controlled well by using the etching selectivity between different materials, which can achieve etching uniformity better compared to time control.

9 Claims, 4 Drawing Sheets

(51) Int. Cl.
*H01L 29/66* (2006.01)
*H01L 21/02* (2006.01)
*H01L 21/306* (2006.01)
*H01L 21/3105* (2006.01)
*H01L 29/772* (2006.01)

(52) U.S. Cl.
CPC .... *H01L21/02667* (2013.01); *H01L 21/30625* (2013.01); *H01L 21/31055* (2013.01); *H01L 29/66795* (2013.01)

(56) References Cited

U.S. PATENT DOCUMENTS

| | | | | |
|---|---|---|---|---|
| 7,268,058 | B2* | 9/2007 | Chau | H01L 29/785 257/E21.442 |
| 7,316,945 | B2 | 1/2008 | Park | |
| 8,236,634 | B1* | 8/2012 | Kanike | H01L 27/1211 257/E21.431 |
| 8,354,320 | B1* | 1/2013 | Xie | H01L 29/66795 438/279 |
| 8,809,178 | B2* | 8/2014 | Liu | H01L 29/66795 438/151 |
| 9,070,771 | B2* | 6/2015 | Reznicek | H01L 21/823821 |
| 2005/0158970 | A1* | 7/2005 | Chau | H01L 29/785 438/479 |
| 2005/0227435 | A1* | 10/2005 | Oh | B82Y 10/00 438/257 |
| 2006/0049455 | A1* | 3/2006 | Jang | H01L 29/4236 257/330 |
| 2007/0048934 | A1* | 3/2007 | Kim | H01L 29/785 438/254 |
| 2008/0087942 | A1* | 4/2008 | Hsu | H01L 27/115 257/324 |
| 2008/0265338 | A1* | 10/2008 | Yu | H01L 29/66795 257/397 |
| 2008/0277714 | A1* | 11/2008 | Kim | H01L 27/115 257/321 |
| 2008/0290402 | A1* | 11/2008 | Chung | H01L 21/823418 257/327 |
| 2009/0090955 | A1* | 4/2009 | Wang | H01L 21/28273 257/316 |
| 2009/0238010 | A1* | 9/2009 | Juengling | G11C 11/401 365/189.07 |
| 2009/0321836 | A1* | 12/2009 | Wei | H01L 29/66628 257/365 |
| 2010/0176375 | A1* | 7/2010 | Lochtefeld | H01L 31/1804 257/14 |
| 2011/0097863 | A1* | 4/2011 | Shieh | H01L 21/845 438/268 |
| 2012/0161202 | A1* | 6/2012 | Cappellani | H01L 29/205 257/192 |
| 2012/0193712 | A1 | 8/2012 | Bryant et al. | |
| 2012/0292707 | A1* | 11/2012 | Toh | B82Y 10/00 257/365 |
| 2013/0045580 | A1* | 2/2013 | Cho | H01L 21/823431 438/296 |
| 2013/0069167 | A1* | 3/2013 | Zhu | H01L 21/823431 257/369 |
| 2013/0146942 | A1* | 6/2013 | Zhu | H01L 29/66795 257/190 |
| 2013/0154007 | A1* | 6/2013 | Cheng | H01L 29/66795 257/352 |
| 2013/0168740 | A1* | 7/2013 | Chen | B81C 1/00238 257/254 |
| 2013/0175659 | A1* | 7/2013 | Liu | H01L 29/66795 257/506 |
| 2013/0234147 | A1* | 9/2013 | Wu | H01L 29/66795 257/76 |
| 2014/0027816 | A1* | 1/2014 | Cea | H01L 29/66545 257/192 |
| 2014/0042547 | A1* | 2/2014 | Khakifirooz | H01L 27/0805 257/368 |
| 2014/0061820 | A1* | 3/2014 | Reznicek | H01L 21/823821 257/401 |
| 2014/0080275 | A1* | 3/2014 | Harley | H01L 29/66545 438/283 |
| 2014/0087547 | A1* | 3/2014 | Miyano | H05B 6/806 438/486 |
| 2014/0284723 | A1* | 9/2014 | Lee | H01L 21/823821 257/369 |
| 2014/0353721 | A1* | 12/2014 | Reznicek | H01L 21/823821 257/192 |
| 2015/0200141 | A1* | 7/2015 | Zhu | H01L 21/0223 257/401 |
| 2015/0228480 | A1* | 8/2015 | Yin | H01L 29/00 438/283 |
| 2015/0236134 | A1* | 8/2015 | Zhong | H01L 29/665 438/157 |
| 2015/0255594 | A1* | 9/2015 | Zhu | H01L 29/78696 257/77 |
| 2015/0255609 | A1* | 9/2015 | Zhu | H01L 29/6681 257/401 |
| 2015/0262883 | A1* | 9/2015 | Zhu | H01L 21/31055 438/283 |
| 2015/0270263 | A1* | 9/2015 | Zhu | H01L 27/08869 257/386 |
| 2015/0303274 | A1* | 10/2015 | Zhu | H01L 29/66795 438/283 |

* cited by examiner

US 9,343,530 B2

METHOD FOR MANUFACTURING FIN STRUCTURE OF FINFET

CROSS REFERENCE TO RELATED APPLICATION

This application is a national stage application, filed under 35 U.S.C. §371, of PCT Application No. PCT/CN2012/083475, filed on Oct. 25, 2012, entitled "METHOD FOR MANUFACTURING FIN STRUCTURE OF FINFET", which claimed priority to Chinese Application No. 201210395585.2, filed on Oct. 18, 2012, all of which are hereby incorporated by reference in their entirety.

TECHNICAL FIELD

The present invention relates to semiconductor manufacturing technology. In particular, the present invention relates to a method of manufacturing a fin structure of a FinFET.

BACKGROUND ART

With the development of semiconductor technology, higher driving current is required for faster transistors. Since the driving current of a transistor is proportional to the gate width of the transistor, in order to increase driving current, larger gate width is required. However, increase of the gate width conflicts with scaling of a semiconductor element. Thus, a novel three-dimensional structure transistor—fin field effect transistor (FinFET) is developed. In a FinFET structure, a gate is formed on a fin structure vertical to a substrate. By control of the gate, a conductive channel can be formed on both sides of the fin structure. The advantages of FinFETs include suppressing short channel effect (SCE), increasing driving current, and reducing leakage current.

Currently, FinFET still encounters many problems in manufacturing. The traditional process, as shown in FIG. 1(a) to FIG. 1(c), comprises: providing a substrate; removing part of the substrate to form a fin structure; and forming an insulation dielectric layer of an isolated fin structure. Generally, the step of forming an isolation dielectric layer comprises: depositing an insulation dielectric layer; performing chemical mechanical polishing (CMP) to stop at top of the fin structure; and etching part of the insulation dielectric layer so that the fin structure is exposed to a certain height. Since no etching barrier layer exists, the etching can only be stopped by controlling the etching time. Etching rates at different positions on a silicon chip may be different, and etching rates of different silicon chips may also be different. Thus, the fin exposed from the isolation dielectric layer may have different heights, which may affect the gate width of FinFETs, so that the device on different silicon chips and at different positions of silicon chips may have different properties, which is disadvantageous for large scale integration and mass production of devices.

SUMMARY OF THE INVENTION

The object of the present invention is to provide a method of manufacturing a Fin structure of a FinFET, wherein by forming a multilayer film and controlling the height of the fin structure by the film thickness, the height of the fin structure exposed outside the insulation layer is substantially consistent.

According to one aspect of the present invention, there is provided a method of manufacturing a fin structure of a FinFET, the method comprising the steps of:

a) providing a substrate;
b) forming a first dielectric layer;
c) forming a second dielectric layer, wherein a material of the portion of the second dielectric layer, which is adjacent to the first dielectric layer, is different from that of the first dielectric layer;
d) forming an opening through the second dielectric layer and the first dielectric layer to expose the substrate;
e) filling a semiconductor material in the opening; and
f) removing the second dielectric layer to form a fin structure.

In the present invention, a first dielectric layer and a second dielectric layer are formed, and the height of the fin structure in FinFET may be controlled by the thickness of the second dielectric layer. The thickness of the film is uniform, and can be controlled by measurement. By using the etching selectivity with respect to different materials, the etching can be better controlled to stop than the case in which the etching is controlled by time, and can achieve better etching uniformity. The height of the fin structure formed by the method described above is substantially consistent, and thus the consistency of properties of devices on different silicon chips and at different positions of silicon chips may be achieved.

BRIEF DESCRIPTION OF THE FIGURES

By reading the detailed description of the non-limiting embodiments made with reference to the following figures, the other features, objects and advantages of the present invention will become more apparent.

The same or similar reference signs in the figures denote the same or similar parts.

DESCRIPTION OF THE PREFERRED EMBODIMENTS

The embodiments of the present invention are described below in detail, and the illustrative examples of the embodiments are shown in the figures. The embodiments described with reference to the figures are exemplary for explaining the present invention only, and cannot be construed as limiting the present invention.

The following disclosure provides many different embodiments or examples to achieve different structures of the present invention. In order to simplify the disclosure of the present invention, parts and settings of specific examples will be described hereinafter. Of course, they are merely exemplary, and are not intended to limit the present invention. In addition, numbers and/or letters in the present invention can be repeated in different examples. Such repetition is for the purpose of simplification and clarity, and does not indicate the relationship between various embodiments and/or settings discussed. Further, the present invention provides examples of a variety of particular processes and materials, but those skilled in the art may be aware of the applicability of other processes and/or the use of other materials. It should be noted that the parts illustrated in the figures are not necessarily drawn to scale. In the present invention, description of well-known components and processing technologies and processes are omitted to avoid unnecessarily limiting the present invention.

Figure 1A:
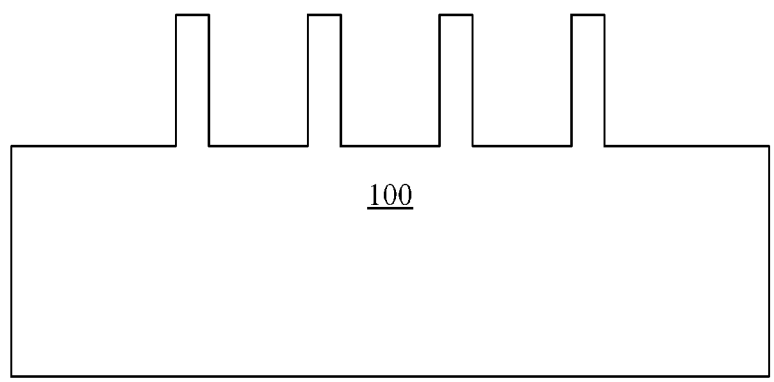
FIG. 1(a) to FIG. 1(c) are schematic cross-sectional views of various stages in manufacturing a fin structure of a FinFET in the prior art process.
Figure 1B:
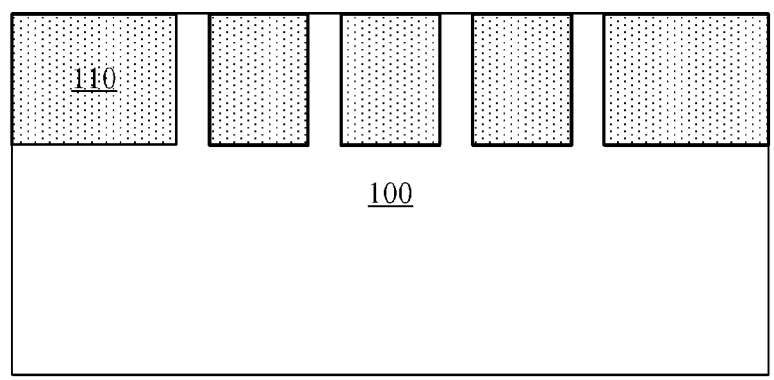
Figure 1C:
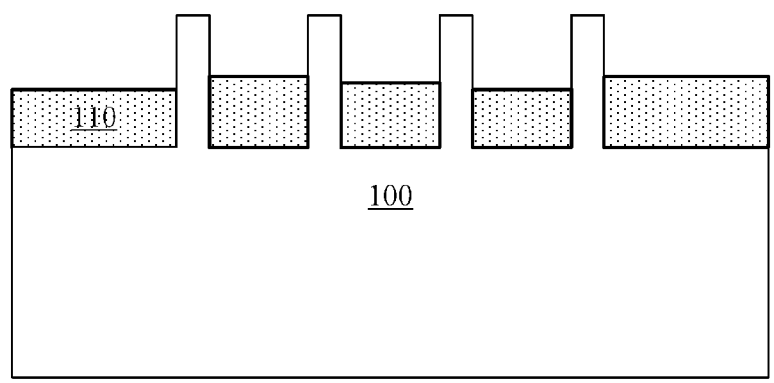
Figure 2:
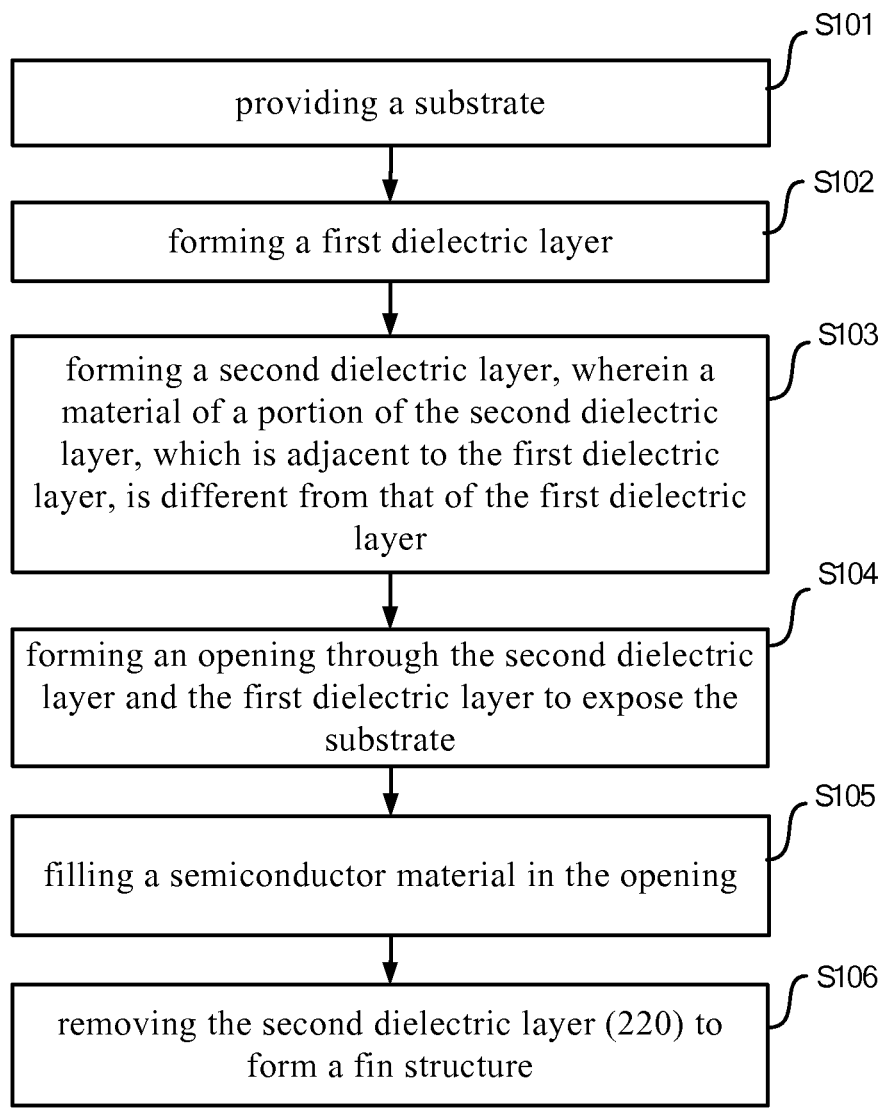
FIG. 2 is a flowchart of the method for manufacturing a fin structure of a FinFET according to the present invention.

The method of manufacturing a Fin structure of a FinFET in FIG. 2 is described in detail below with reference to FIG. 3(a) to FIG. 3(d).

Figure 3A:
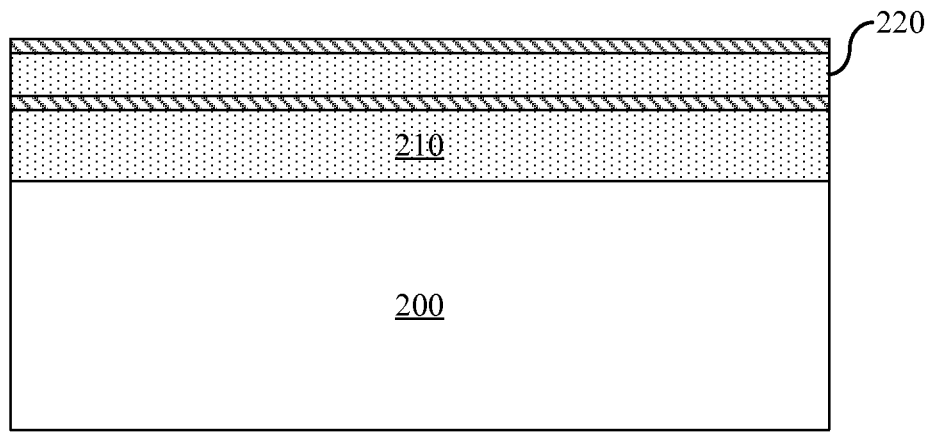
FIG. 3(a) to FIG. 3(d) are schematic cross-sectional views of various stages in manufacturing a fin structure of a FinFET according to the procedure shown in FIG. 2 according to a preferred embodiment of the present invention.

Referring to FIG. 2 and FIG. 3(a), in step S101, there is provided a substrate 200.

In the present embodiment, the substrate 200 includes a silicon substrate (e.g., a silicon wafer). According to design requirements (such as a P-type or N-type substrate) well known in the art, the substrate 200 may include various doping configurations. In other embodiments, the substrate 200 may also include other basic semiconductors, such as germanium. Alternatively, the substrate 200 may include a compound semiconductor (such as a material of Group III-V), for example, silicon carbide, gallium arsenide, and indium arsenide. Typically, the substrate 200 may have, but not limited to, a thickness of approximately several hundred microns, for example, a thickness in the range of 400 μm to 800 μm.

Referring to FIG. 2 and FIG. 3(a), in the step S102, a first dielectric layer 210 is formed on the substrate 20. The first dielectric layer 210 can be formed by chemical vapor precipitate (CVD), plasma-enhanced CVD, high-density plasma CVD, spin coating and/or other suitable processes. The material of the first dielectric layer 210 may comprise silicon oxide, silicon oxynitride, or combinations thereof, and/or other suitable insulating materials. The thickness of the first dielectric layer 210 is the thickness of the isolation dielectric layer of the device finally formed, for example, in the range of about 100 to 500 nm.

Referring to FIG. 2 and FIG. 3(a), in step S103, a second dielectric layer 220 is formed on the first dielectric layer 210, the material of the portion of the second dielectric layer 220 which is adjacent to the first dielectric layer may be different from that of the first dielectric layer 210. The second dielectric layer 220 may be a monolayer or multilayer structure. When the second dielectric layer 220 is a multilayer structure, the material of the sub-layer closest to the first dielectric layer is different from the first dielectric layer below. The films of various layers of the second dielectric layer 220 can be formed by chemical vapor deposition (CVD), plasma-enhanced CVD, high-density plasma CVD, spin coating and/or other suitable processes. For example, if the material of the first dielectric layer is silicon oxide, then the second dielectric layer 220 may comprise three films, which are a silicon nitride layer, a silicon oxide layer and a silicon nitride layer from the bottom to the top. The thickness of the silicon nitride layer can be about 5 to 10 nm, where the uppermost silicon nitride layer may be used as a barrier layer for chemical mechanical polishing while filling a semiconductor material later, and the lowermost silicon nitride layer ensures the selectivity with respect to the first dielectric layer below while etching the second dielectric layer. The range of the thickness of the silicon oxide layer may be, for example, about 100 to 500 nm for controlling the height of the fin structure to be formed. Alternatively, the second dielectric layer 220 can be a monolayer silicon nitride film, which can either serve as a barrier layer for chemical mechanical polishing and ensures the selectivity with respect to the first dielectric layer below while etching the second dielectric layer. The monolayer silicon nitride film has a thickness in the range of, for example, from 100 to 500 nm, for controlling the height of the fin structure to be formed.

Figure 3B:
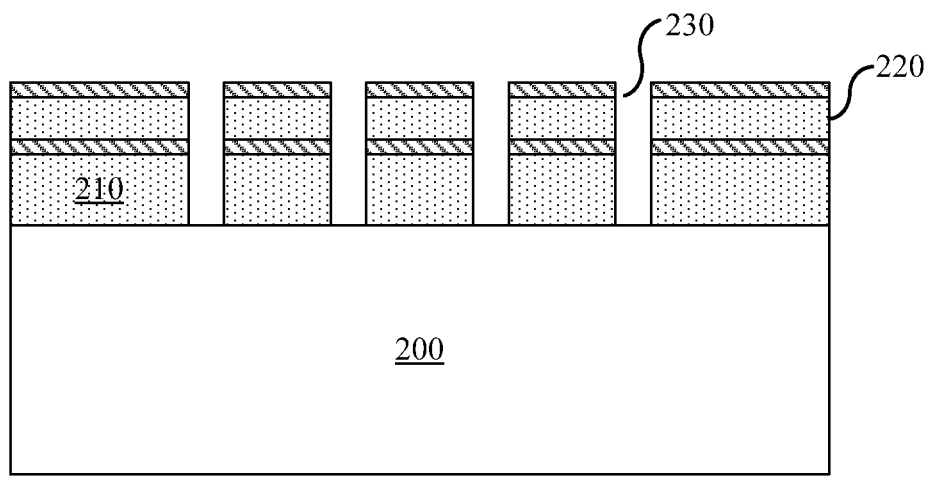

Referring to FIG. 2 and FIG. 3(b), in step S104, an opening through the second dielectric layer 220 and the first dielectric layer 210 is formed to partially expose the substrate 200. In the present embodiment, the second dielectric layer 220 is etched, and then the first dielectric layer 210 is etched, until the substrate 200 is exposed to form an opening 230. Before the etching, the second dielectric layer 220 is covered with a photoresist layer (not shown), and then exposure and development are performed to form a photoresist pattern. The photoresist pattern is used as a mask, and dry etching such as plasma etching is performed to anisotropically etch the second dielectric layer 220 and the first dielectric layer 210. The gases in dry etching may include sulfur hexafluoride ($SF_6$), hydrogen bromide (HBr), hydrogen iodide (HI), chlorine, argon, helium, methane (and chlorinated methane), acetylene, ethylene, or any combination thereof, and/or other suitable materials. The opening width is the width of the fin structure finally formed in the range of, for example, about 10 to 50 nm.

Figure 3C:
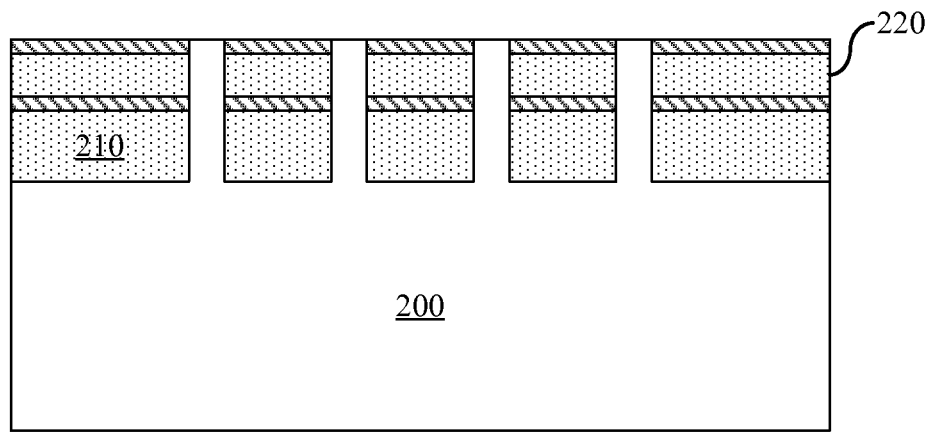

Referring to FIG. 2 and FIG. 3(c), in step S105, the opening 230 is filled with a semiconductor material. The semiconductor material can be doped or undoped monocrystalline silicon. In one embodiment, the method of filling the opening 230 can be epitaxial growth. In-situ doping can be performed in the epitaxial growth, and the doping can also be performed by ion implantation and annealing after epitaxial growth. As for NMOS, the semiconductor material can be P-type doped; and as for PMOS, the semiconductor material can be N-type doped. In another embodiment, if the substrate is monocrystalline silicon, amorphous silicon can be deposited in the opening 230, and then amorphous silicon is crystallized by an annealing process so as to form monocrystalline silicon. Annealing can be carried out by other suitable methods including rapid thermal annealing, spike annealing, and the like. After filling of the semiconductor material, Chemical Mechanical Polishing (CMP) may be performed to the semiconductor material and stops at a barrier layer for the chemical mechanical polishing, so that the upper surface of the semiconductor material is flushed with the upper surface of the second dielectric layer 220 (here, the term "flushed with" means that the height difference is within the process error allowance).

Figure 3D:
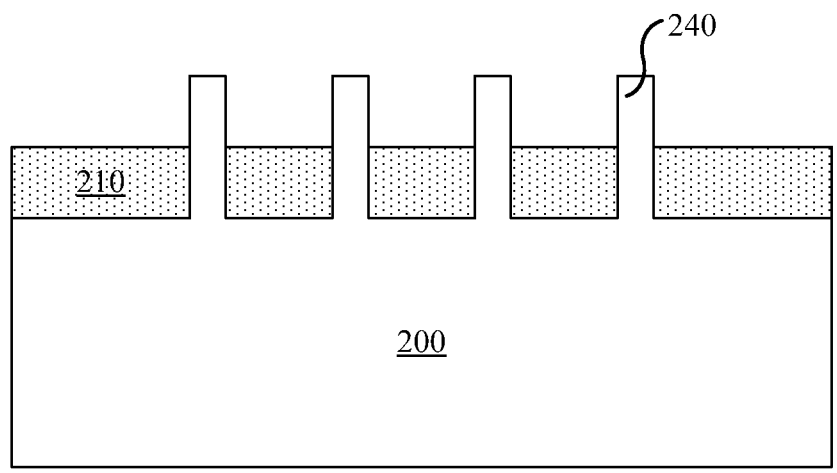

Referring to FIG. 2 and FIG. 3(d), in step S106, the second dielectric layer 220 is removed to form a fin structure 240. The second dielectric layer 220 can be removed by wet etching and/or dry etching. Hot phosphoric acid ($H_3PO_4$), diluted hydrofluoric acid (DHF), or other suitable etching solutions may be employed in the wet etching process; and sulfur hexafluoride ($SF_6$), hydrogen bromide (HBr), hydrogen iodide (HI), chlorine, argon, helium, methane (and chlorinated methane), acetylene, ethylene, and the like, or any combination thereof, and/or other suitable materials may be employed in the dry etching process. Since the material of the portion of the second dielectric layer 220, which is adjacent to the first dielectric layer, is different from that of the first dielectric layer 210, an etching process and/or an etching gas having highly etching selectivity may be selected so that the etching precisely stops at the surface of the first dielectric layer. Therefore, it is possible to precisely control the uniformity of the height of the fin structure with the isolation dielectric layer being exposed in the entire wafer surface.

While the exemplary embodiments and advantages thereof have been described in detail, it should be understood that various changes, substitutions and modifications can be made to these embodiments without departing from the spirit of the invention and the scope of protection defined by the appended claims. For other examples, those skilled in the art should readily understand that the order of process steps can be varied while maintaining the scope of protection of the present invention.

In addition, the range of applications of the present invention is not limited to the processes, institutions, manufacturing, composition of matter, means, methods and steps of the specific embodiments described in the description. In accordance with the disclosure of the present invention, those skilled in the art may readily understand that as for the processes, institutions, manufacturing, composition of matter, means, methods, or steps currently existing or to be developed later in which they implement substantially the same function or achieve substantially the same result as the corresponding embodiments descried in the present invention, they can be applied in accordance with the present invention. Accordingly, the appended claims of the present invention seek to include these processes, institutions, manufacturing, composition of matter, means, methods, or steps within the scope of its protection.

The invention claimed is:

1. A method of manufacturing a fin structure of a FinFET, comprising:
   a) providing a substrate;
   b) forming a first dielectric layer;
   c) forming a second dielectric layer, wherein a material of a portion of the second dielectric layer, which is adjacent to the first dielectric layer, is different from that of the first dielectric layer;
   d) forming an opening through the second dielectric layer and the first dielectric layer to expose the substrate;
   e) filling a semiconductor material in the opening; and
   f) removing the second dielectric layer to form the fin structure, wherein
   the second dielectric layer comprises a three-layer film including a silicon nitride layer, a silicon oxide layer, and a silicon nitride layer from the bottom, and
   the thickness of the silicon oxide layer is the height of the exposed fin structure, which is in the range of 100 to 500 nm.

2. The method according to claim 1, wherein in the step b), the material of the first dielectric layer comprises silicon oxide.

3. The method according to claim 1 or 2, wherein the thickness of the first dielectric layer is the thickness of an isolation dielectric layer of the FinFET, which is in the range of 100 to 500 nm.

4. The method according to claim 1, wherein the thickness of the silicon nitride layer is 5 to 10 nm.

5. The method according to claim 1, wherein in the step d), the width of the opening is the width of the fin structure, which is in the range of 10 to 50 nm.

6. The method according to claim 1, wherein in the step e), the semiconductor material is doped or undoped monocrystalline silicon.

7. The method according to claim 1, wherein in the step e), the semiconductor material is filled in the opening by epitaxial growth.

8. The method according to claim 1, wherein in the step e), the semiconductor material is filled in the opening by depositing noncrystalline silicon and annealing to form monocrystalline silicon.

9. The method according to claim 1, 7 or 8, wherein in the step e), further comprising performing chemical mechanical polishing after filling the semiconductor material.

* * * * *